(12) United States Patent
Rietsch et al.

(10) Patent No.: US 11,536,594 B2
(45) Date of Patent: Dec. 27, 2022

(54) SENSOR COMPONENT, PRE-ASSEMBLY ARRANGEMENT FOR A SENSOR COMPONENT, AND METHOD FOR PRODUCING A SENSOR COMPONENT

(71) Applicant: Vitesco Technologies Germany GMBH, Hannover (DE)

(72) Inventors: Jürgen Rietsch, Wendelstein (DE); Andreas Plach, Forchheim (DE); Stephan Bandermann, Teublitz (DE); Thomas Schmidt, Burglengenfeld (DE); Andreas Albert, Höchstadt/Aisch (DE); Klaus Scharrer, Mittelweg (DE); Bernd Seitz, Nuremberg (DE); Jens mEnke, Allersberg (DE)

(73) Assignee: Vitesco Technologies Germany GmbH, Regensburg (DE)

( * ) Notice: Subject to any disclaimer, the term of this patent is extended or adjusted under 35 U.S.C. 154(b) by 177 days.

(21) Appl. No.: 16/797,632

(22) Filed: Feb. 21, 2020

(65) Prior Publication Data
US 2020/0191619 A1 Jun. 18, 2020

Related U.S. Application Data

(63) Continuation of application No. PCT/EP2018/072564, filed on Aug. 21, 2018.

(30) Foreign Application Priority Data

Aug. 23, 2017 (DE) .................. 10 2017 214 780

(51) Int. Cl.
*G01D 11/24* (2006.01)
*G01D 5/14* (2006.01)
(Continued)

(52) U.S. Cl.
CPC .......... *G01D 11/245* (2013.01); *G01D 5/142* (2013.01); *G01D 5/16* (2013.01); *G01D 11/30* (2013.01);
(Continued)

(58) Field of Classification Search
CPC ........ G01D 11/245; G01D 5/142; G01D 5/16; G01D 11/30; H05K 1/0278; H05K 1/181;
(Continued)

(56) References Cited

U.S. PATENT DOCUMENTS 5,637,995 A 6/1997 Izawa
6,927,344 B1 * 8/2005 Gall ...................... H05K 1/0278
174/254

(Continued)

FOREIGN PATENT DOCUMENTS

CN 1918951 A 2/2007
CN 102124307 A 7/2011
(Continued)

OTHER PUBLICATIONS

Japanese Office Action dated Jan. 8, 2021 for corresponding Japanese Patent Application No. 2020-511386.
(Continued)

*Primary Examiner* — Farhana A Hoque

(57) ABSTRACT

A sensor component for a transmission of a motor vehicle is provided. The sensor component includes a printed circuit board having a first printed circuit board region and a second printed circuit board region. The first printed circuit board region is delimited from the second printed circuit board region by a milled groove and is angled with respect to the second printed circuit board region along the milled groove. A sensor, such as a magnetoresistive sensor or a Hall sensor, is arranged in or on the first printed circuit board region. A
(Continued)

pre-assembly arrangement and a method for producing such a sensor component are also provided.

18 Claims, 7 Drawing Sheets

(51) Int. Cl.
    *G01D 5/16*     (2006.01)
    *G01D 11/30*     (2006.01)
    *H05K 1/02*     (2006.01)
    *H05K 1/18*     (2006.01)
    *H05K 3/28*     (2006.01)
    *H05K 5/06*     (2006.01)

(52) U.S. Cl.
    CPC ........... *H05K 1/0278* (2013.01); *H05K 1/181* (2013.01); *H05K 3/284* (2013.01); *H05K 5/065* (2013.01); *H05K 2201/10151* (2013.01); *H05K 2201/10393* (2013.01); *H05K 2203/1316* (2013.01); *H05K 2203/1327* (2013.01)

(58) Field of Classification Search
    CPC ................... H05K 3/284; H05K 5/065; H05K 2201/10151; H05K 2201/10393; H05K 2203/1316; H05K 2203/1327
    USPC ...................................................... 324/200.2
    See application file for complete search history.

(56) References Cited

U.S. PATENT DOCUMENTS

| | | |
|---|---|---|
| 8,220,990 B2 | 7/2012 | Mitchell et al. |
| 8,528,413 B2 | 9/2013 | Seitz et al. |
| 8,904,864 B2 | 12/2014 | Ludwig |
| 8,916,079 B2 | 12/2014 | Ludwig |
| 9,271,399 B2 | 2/2016 | Braun et al. |
| 9,453,745 B2 * | 9/2016 | Hortig ............... G01D 11/245 |
| 9,649,796 B2 | 5/2017 | Panis et al. |
| 10,785,883 B2 | 9/2020 | Albert et al. |
| 2005/0190531 A1 | 9/2005 | Gall |
| 2007/0029399 A1 | 2/2007 | Schuster |
| 2010/0071449 A1 | 3/2010 | Karrer et al. |
| 2011/0179889 A1 | 7/2011 | De Volder |
| 2011/0181221 A1 | 7/2011 | Kyohei |
| 2011/0314935 A1 | 12/2011 | Krippner |
| 2012/0247205 A1* | 10/2012 | Hortig ............... G01D 11/245 73/431 |
| 2013/0161478 A1 | 7/2013 | Wieczorek et al. |
| 2013/0175733 A1 | 7/2013 | D Volder |
| 2014/0001897 A1 | 1/2014 | Wallrafen et al. |
| 2014/0352461 A1 | 12/2014 | Panis |
| 2016/0103147 A1* | 4/2016 | Vich ............... H01R 4/28 324/156 |
| 2016/0233595 A1 | 8/2016 | Gundersen |
| 2017/0176486 A1 | 6/2017 | Steinbrink et al. |
| 2017/0288346 A1 | 10/2017 | Wirnitzer et al. |
| 2017/0328746 A1 | 11/2017 | Hauggard |
| 2018/0224304 A1* | 8/2018 | Contet ............... G01D 11/24 |
| 2018/0224340 A1 | 8/2018 | Contet et al. |
| 2018/0299348 A1 | 10/2018 | Albert et al. |

FOREIGN PATENT DOCUMENTS

| | | |
|---|---|---|
| CN | 102171536 A | 8/2011 |
| CN | 102317750 A | 1/2012 |
| CN | 204316944 U | 5/2015 |
| CN | 107003157 A | 8/2017 |
| CN | 107063327 A | 8/2017 |
| DE | 102008008336 A1 | 9/2008 |
| DE | 102008018199 A1 | 10/2009 |
| DE | 102008064047 A1 | 4/2010 |
| DE | 102009026806 A1 | 12/2010 |
| DE | 102009027343 A1 | 1/2011 |
| DE | 102010005305 A1 | 7/2011 |
| DE | 102010025591 A1 | 12/2011 |
| DE | 102010031679 A1 | 1/2012 |
| DE | 102010061750 A1 | 5/2012 |
| DE | 102011002739 A1 | 7/2012 |
| DE | 102011013449 A1 | 9/2012 |
| DE | 102014202192 | 9/2012 |
| DE | 102014205386 A1 | 9/2012 |
| DE | 102011006594 A1 | 10/2012 |
| DE | 102011006622 A1 | 10/2012 |
| DE | 102011081016 A1 | 2/2013 |
| DE | 102012110597 A1 | 5/2013 |
| DE | 102011121412 A1 | 6/2013 |
| DE | 102013205155 A1 | 9/2014 |
| DE | 102014205308 B3 | 3/2015 |
| DE | 102014216587 A1 | 9/2015 |
| DE | 102014216590 A1 | 9/2015 |
| DE | 102014215920 A1 | 2/2016 |
| DE | 102014216770 A1 | 2/2016 |
| DE | 102014219030 A1 | 3/2016 |
| DE | 102015219569 A1 | 4/2017 |
| DE | 102015219571 A1 | 4/2017 |
| DE | 102015225115 A1 | 6/2017 |
| DE | 102015225155 A1 | 6/2017 |
| DE | 102015225159 A1 | 6/2017 |
| EP | 0694765 A1 | 1/1996 |
| EP | 0800087 A2 | 10/1997 |
| EP | 2408279 A1 | 1/2012 |
| EP | 3007527 A1 | 4/2016 |
| FR | 2965348 A1 | 3/2012 |
| JP | H0727571 A | 1/1995 |
| JP | H11316134 A | 11/1999 |
| JP | 2003161744 A | 6/2003 |
| JP | 2008275639 A | 11/2008 |
| JP | 2010093869 A | 4/2010 |
| JP | 2013007615 A | 1/2013 |
| KR | 20150110411 A | 10/2015 |
| WO | 2008113312 A1 | 9/2008 |
| WO | 2010038102 A1 | 4/2010 |
| WO | 2010038103 A1 | 4/2010 |
| WO | 2017028944 A1 | 2/2017 |

OTHER PUBLICATIONS

Chinese Office Action dated Apr. 29, 2021 for corresponding Chinese Patent Application No. 201880054164.9.
German Office Action dated May 16, 2018 for corresponding German Patent Application No. 10 2017 214 780.6.
International Search Report and Written Opinion dated Nov. 23, 2018 from corresponding International Patent Application No. PCT/EP2018/072564.
Chinese Notice of Allowance dated May 31, 2022 for corresponding Chinese Patent Application No. 201880054164.9.

* cited by examiner

SENSOR COMPONENT, PRE-ASSEMBLY ARRANGEMENT FOR A SENSOR COMPONENT, AND METHOD FOR PRODUCING A SENSOR COMPONENT

CROSS-REFERENCE TO RELATED APPLICATIONS

This application claims the benefit of PCT Application PCT/EP2018/072564, filed Aug. 21, 2018, which claims priority to German Application DE 10 2017 214 780.6, filed Aug. 23, 2017. The disclosures of the above applications are incorporated herein by reference.

TECHNICAL FIELD

The disclosure relates to a sensor component, for example, a sensor component for a transmission of a motor vehicle, and to a pre-assembly arrangement and a method for producing such a sensor component.

BACKGROUND

A multiplicity of electronic sensors find application in transmissions for motor vehicles, for example, in automatic transmissions. By way of example, sensors here are rotational speed sensors or gear actuator sensors, which monitor the rotational speed and/or position of mechanical components of the transmission. For this purpose, the corresponding sensors have to be arranged in proximity to the components to be monitored. This is generally implemented within so-called sensor domes in the transmission casing.

It is customary here to arrange control electronics connected to one or more sensor domes together with the sensor domes in the interior of the transmission casing in order to keep the signal communication paths between the sensors and the assigned electronics as short as possible, such that measurement errors can be avoided or reduced.

On account of the limited structural space in the transmission casing, it is desirable to make the sensor components particularly compact. However, this often necessitates redesigning the outer shape of the sensor components for each transmission itself, which can considerably increase the development and production costs.

SUMMARY

One aspect of the disclosure provides a sensor component which is compact and at the same time flexibly adaptable to different transmission geometries. Another aspect of the disclosure provides a pre-assembly arrangement and yet another aspect of the disclosure provides a method for producing such a sensor component.

The sensor component, for example, for a transmission of a motor vehicle, includes a printed circuit board having a first printed circuit board region and a second printed circuit board region. The first printed circuit board region is delimited from the second printed circuit board region by a milled groove and is angled with respect to the second printed circuit board region along the milled groove. A sensor, for example, a magnetoresistive sensor or a Hall sensor, is arranged in or on the first printed circuit board region.

Implementations of the disclosure may include one or more of the following optional features. In some implementations, the milled groove between the first and second printed circuit board regions locally increases the flexibility of the printed circuit board, and so the printed circuit board can be curved or bent there. As a result, the angle between the printed circuit board regions can be set freely. This allows a flexible adaptation of the outer shape of the sensor component as a whole to different structural space requirements. For this reason, it is possible to use such a sensor component in different transmissions, without a complete redesign becoming necessary. Rather, the adaptation to a new transmission can be effected merely by appropriately setting the angle between the printed circuit board regions.

In some implementations, the sensor is held on the printed circuit board by a clamping device.

This firstly ensures that the sensor is held without any gaps on the printed circuit board or on further additional components, such as magnets or pole plates, for example. A particularly high measurement quality of the sensor may be ensured in this way. Furthermore, the clamping device may also pre-position or center the sensor and ensures that the latter remains in its desired position during subsequent assembly steps.

In some examples, the clamping device engages around the first printed circuit board region, such that the clamping device exerts a clamping force both on the sensor arranged on a first side of the first printed circuit board region, and on a second side of the first printed circuit board region.

This ensures a particularly good retention of the sensor on the printed circuit board and ensures a uniform introduction of force into the sensor, thereby avoiding damage.

In some implementations, the clamping force exerted on the sensor is less than ION.

In this regard, even particularly sensitive sensors can be fixed on the printed circuit board, without giving rise to the risk of damage to the sensor as a result of the clamping.

In some examples, the clamping device has at least one spring element for exerting the clamping force on the sensor.

A clamping device that is simple to secure and at the same time is reversibly releasable is provided in this way. By way of example, instances of incorrect assembly can then be corrected rapidly in a straightforward manner, without rejects arising.

In some implementations, at least one additional component, such as a ring magnet and/or a pole plate and/or a shielding plate, is arranged in or on the first printed circuit board region.

With the use of electromagnetic sensors, such additional components can alter the field line profile in the region of the sensor in a predefined manner. The sensitivity and accuracy of the sensing can be improved as a result.

In some implementations, at least one additional component is held on the first printed circuit board region by the clamping device.

In this case, by way of the clamping device, the additional component can be aligned not only relative to the printed circuit board but also relative to the sensor and can be held securely in this position. Precisely when ring magnets with magnetoresistive sensors are used, it can thereby also be ensured that no gap arises between the sensor and the ring magnet, which gap would lead to deviations from the desired field profile.

In some implementations, the clamping device has at least two spring elements, one spring element of which serves for exerting the clamping force on the additional component and/or for aligning the additional component relative to the sensor.

Besides the holding function, it is thus also possible to achieve an alignment of the relative position of sensor and additional component, the alignment being independent of the alignment with respect to the printed circuit board.

Consequently, since only one spring element has to be optimized for the holding function, while the other spring element can be designed for the alignment, both a particularly secure mounting of the respective components and a particularly good positional orientation of the components with respect to one another and with respect to the printed circuit board are thus ensured.

In some implementations, the sensor and/or the additional component are/is arranged in the region of a through opening in the first printed circuit board region.

A through opening in the region of the sensor makes it possible to arrange additional components on the opposite side of the printed circuit board, with the result that there is a direct contact between sensor and additional component in conjunction with a particularly compact design.

In some examples, the sensor is electrically connected by an electrical connection to firstly at least one conductor track and/or secondly at least one electronic component in the second printed circuit board region. The electrical connection may be a stamped plate.

The use of such an electrical connection enables a contact between the first and second printed circuit board regions which can be adapted to any desired angle between the printed circuit board regions.

In some implementations, the second printed circuit board region has at least one through opening, for example, in the region of an electronic component connected to the sensor.

Such a through opening firstly brings about stress relief in the region of the electronic component and thus reduces for example tensile stresses that can occur during the soldering of the electronic component. Furthermore, when the sensor component is encapsulated with a plastic later by injection molding, the injection-molding compound can penetrate into the through opening, thus resulting in a fixed and secure positively locking connection between the plastic and the printed circuit board.

In some implementations, the printed circuit board and the sensor are encapsulated by a plastic, for example, a thermosetting plastic or a thermoplastic, by injection molding.

This protects the printed circuit board and the sensor against the mechanical and chemical loads in the interior of the transmission casing, where the sensor component is exposed both to strong mechanical vibrations and to thermal and chemical corrosion as a result of the transmission fluid.

In some examples, the sensor component is configured for a transmission control of an automatic transmission of a motor vehicle.

The advantages mentioned are manifested particularly well here.

A pre-assembly arrangement for a sensor component, for example, for a sensor component of the type described, where the pre-assembly arrangement includes a printed circuit board having a first printed circuit board region and a second printed circuit board region. The first printed circuit board region is delimited from the second printed circuit board region by a milled groove. A sensor, such as a magnetoresistive sensor or a Hall sensor, is arranged in the first printed circuit board region and is held on the first printed circuit board region by a clamping device.

Such a pre-assembly arrangement is produced before the final encapsulation of the printed circuit board and the sensor with a plastic by injection molding and can be inserted in this form into an injection-molding tool. The clamping by the clamping device ensures that the individual components of the pre-assembly arrangement do not shift when the printed circuit board regions are bent with respect to one another and during the encapsulation by injection molding.

Furthermore, the disclosure relates to a method for producing a sensor component, such as, a sensor component of the type described above. The method includes: providing a printed circuit board having a first printed circuit board region and a second printed circuit board region, where the first printed circuit board region is delimited from the second printed circuit board region by a milled groove. The method also includes arranging a sensor in the first printed circuit board region and pre-fixing the sensor on the first printed circuit board region by a clamping device. The method also includes inserting the printed circuit board into an injection-molding tool, where a predefined angle between the first printed circuit board region and the second printed circuit board region is predefined during the inserting. In addition, the method includes encapsulating the printed circuit board with a plastic, for example, with a thermosetting plastic or thermoplastic, by injection molding.

This enables the fast and flexible production of a sensor component of the type described above. In order to set different angles between the printed circuit board regions, it is merely necessary here to adapt the injection-molding tool. This can generally be realized in a simple manner, however, by different inserters, slides or the like, and so there is no need to make any changes to the basic construction of the injection-molding tool. Particularly cost-effective production of sensor components adapted to different installation locations is thus possible.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
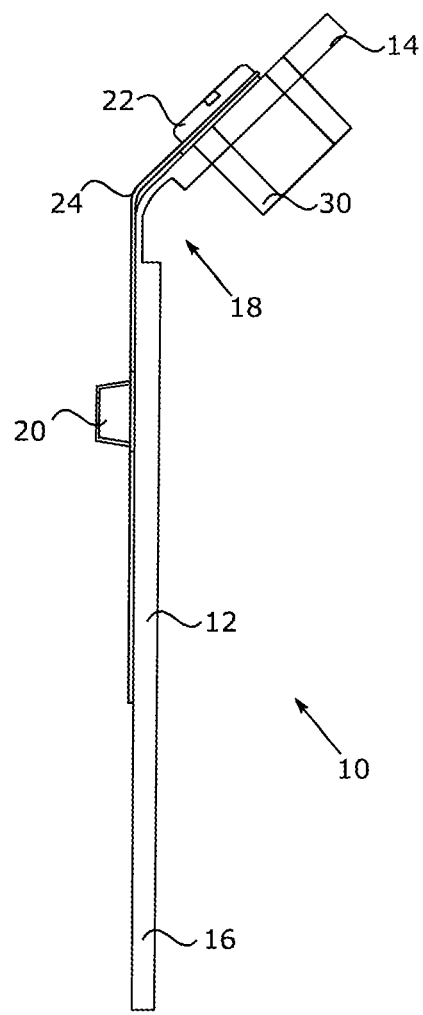
FIG. 1 shows a schematic side view of an exemplary printed circuit board with a sensor for a sensor component.

A sensor component shown in FIG. 1, is designated as a whole by 10. The sensor component 10 includes a printed circuit board 12 having a first printed circuit board region 14 and a second printed circuit board region 16. A milled groove 18 is introduced between the printed circuit board regions 14, 16. The printed circuit board regions 14, 16 are angled relative to one another by an angle of 0° to 120°, for example of 1° to 90°, in order to adapt the sensor component 10 to the available structural space.

The printed circuit board 12 may include customary materials such as fiber-reinforced epoxy resin, polyimide, for example. The material may have a material thickness of 1.00 mm to 2.50 mm, for example, of 0.80 mm to 2.20 mm. The material thickness is reduced in the region of the milled groove 18 in order to enable the printed circuit board regions 14, 16 to be angled relative to one another.

Electronic components 20 are arranged in the second printed circuit board region 16. The electronic components serving for driving the sensor 22 arranged in the first printed circuit board region 14. In this case, just one electronic component 20 is illustrated by way of example in the figures. The electronic components can embody, for example, circuits for pre-amplifying or filtering a signal of the sensor 22. The sensor 22 may be a magnetoresistive sensor or a Hall sensor, which can be used to detect, for example, a rotational speed or a spatial position or movement of a transmission component.

A leadframe 24 serves for electrically connecting the sensor 22 to the electronic components 20. The leadframe extends over the milled groove 18 and is soldered to the printed circuit board regions 14, 16, or components arranged thereon.

Figure 2:
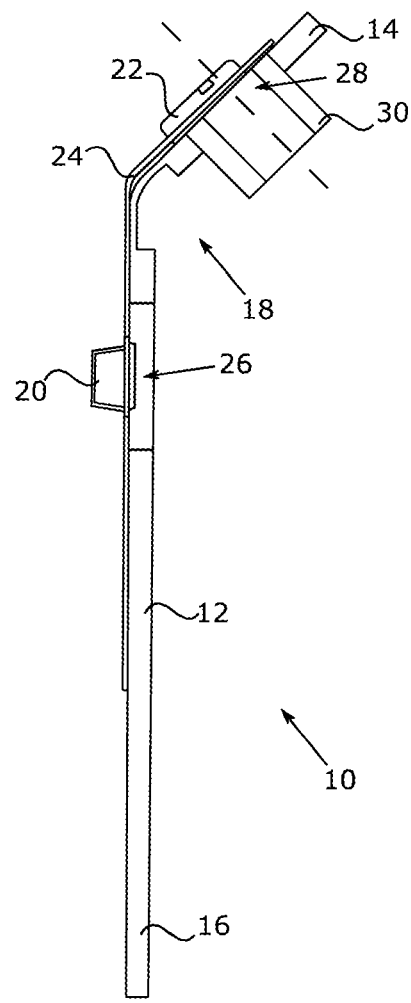
FIG. 2 shows a longitudinal sectional illustration through the printed circuit board and the sensor according to FIG. 1.

As can be shown in the sectional illustration in FIG. 2, both the sensor 22 and at least one electronic component 20 of the first printed circuit board region are arranged in the region of respective through openings 26, 28 through the first and second printed circuit board regions 14, 16.

In this case, the through opening 28 in the second printed circuit board region 16 substantially serves for strain relief vis à vis thermal stresses that can arise during the soldering of the electronic components 20. Furthermore, when the sensor component 10 is encapsulated by injection molding later, the injection-molding compound can penetrate into the through opening 28 and thus form a positively locking engagement with the printed circuit board 12.

By contrast, the through opening 26 in the first printed circuit board region 14 accommodates a ring magnet 30, which can thus be brought into direct contact with the sensor 22 in a particularly compact design. Such a ring magnet 30 makes it possible to adapt the field line profile in the region of the sensor 22 in order to improve the accuracy and sensitivity thereof.

Figure 3:
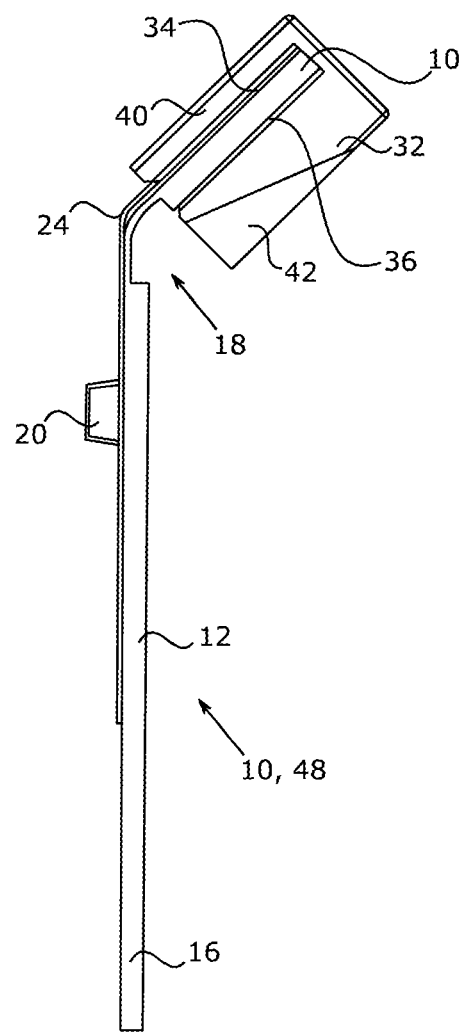
FIG. 3 shows a schematic side view of an exemplary pre-assembly arrangement with a clamping device of a sensor component.
Figure 4:
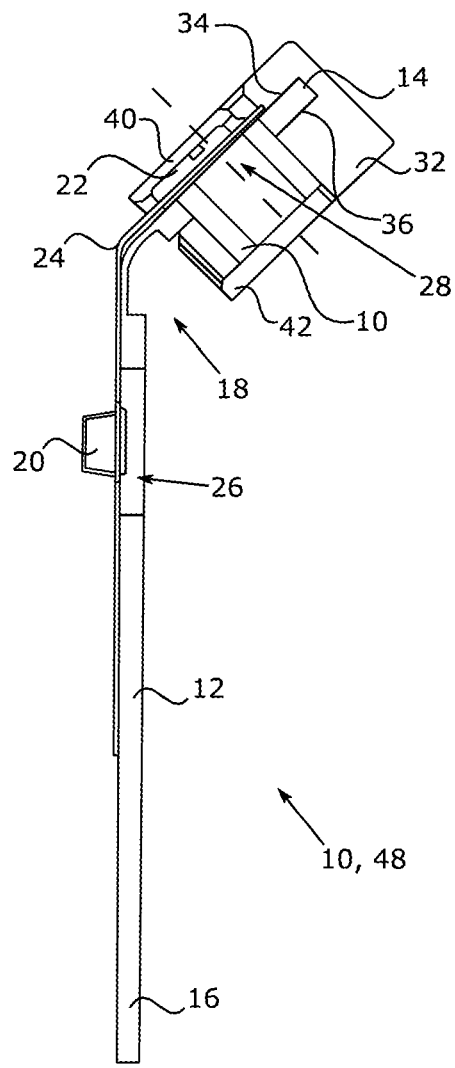
FIG. 4 shows a longitudinal sectional illustration through the pre-assembly arrangement according to FIG. 3.

In order to position and to fix the sensor 22 and the ring magnet 30 both with respect to one another and with respect to the first printed circuit board region 14, a clamping device 32 is fitted before the sensor component 10 is encapsulated by injection molding, as can be shown in FIGS. 3 and 4. The clamping device 32 engages around the first printed circuit board region 14 and exerts a clamping force on the sensor 22, the ring magnet 30, and also the first side 34 and the second side 36 of the first printed circuit board region 14. In this case, the clamping force acting on the sensor 22 is less than 10 N in order to prevent damage to the sensor 22.

Figure 5:
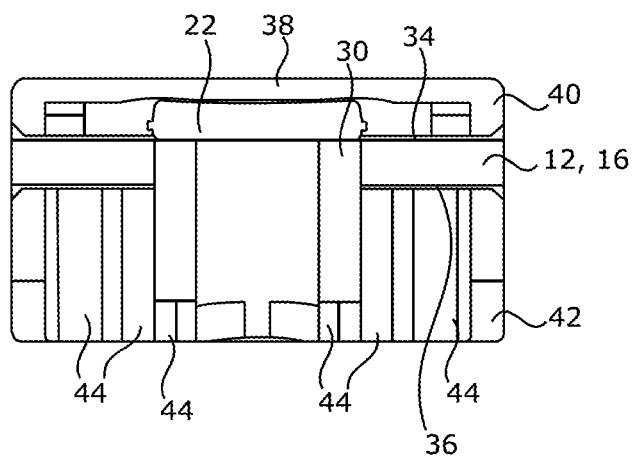
FIG. 5 shows a longitudinal sectional illustration through the pre-assembly arrangement according to FIG. 3 in the region of the clamping device.
Figure 6:
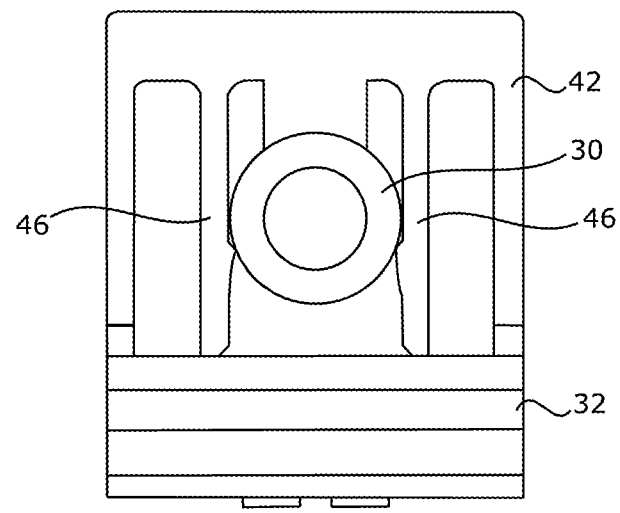
FIG. 6 shows a cross-sectional illustration through the pre-assembly arrangement according to FIG. 3 in the region of the clamping device.
Figure 7:
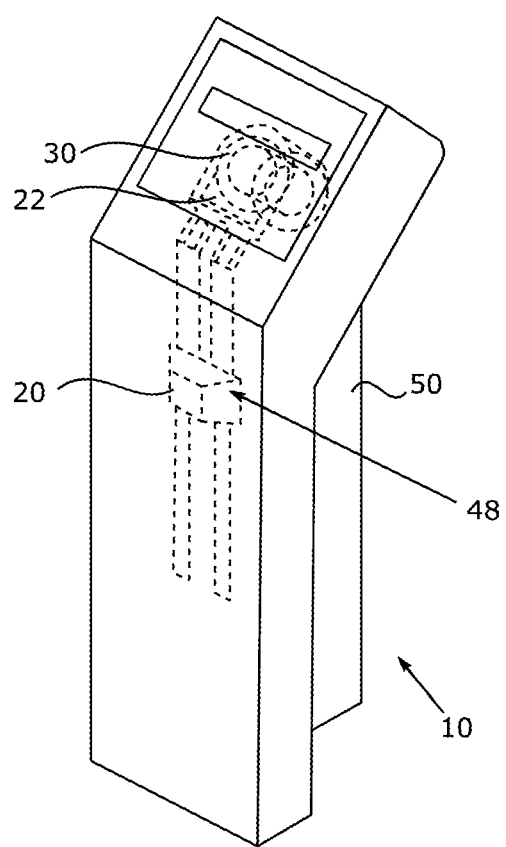
FIG. 7 shows a perspective view of an exemplary sensor component, which is encapsulated with a plastic by injection molding.
Figure 8:
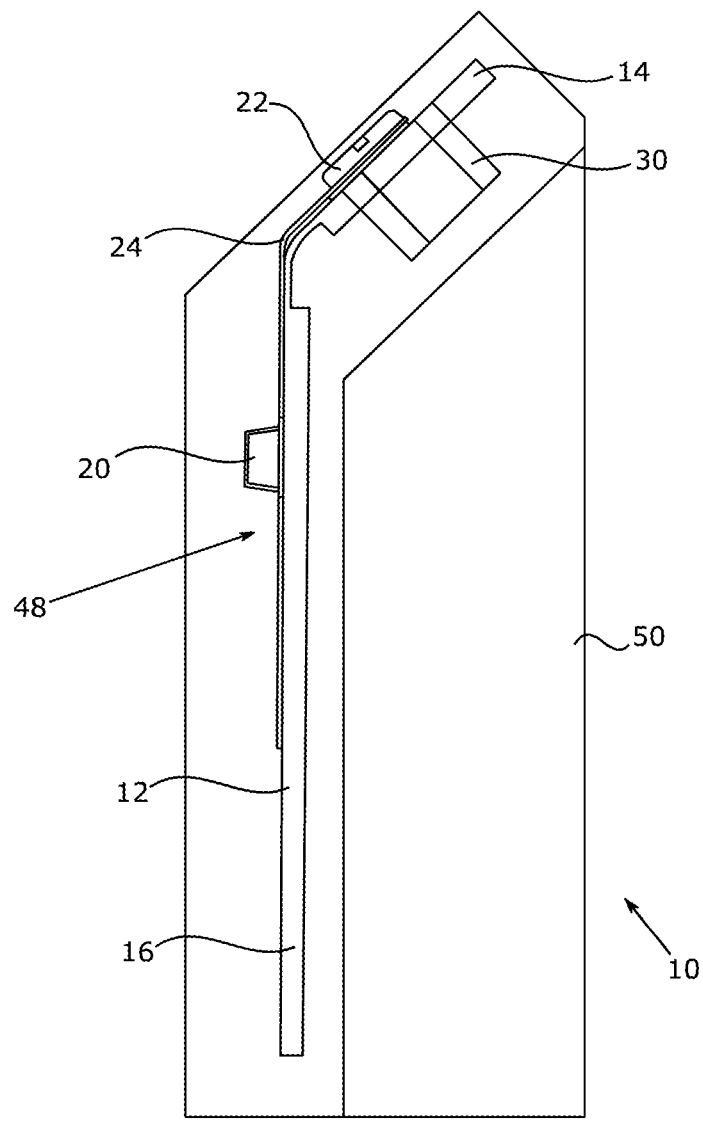
FIG. 8 shows a longitudinal sectional illustration through the sensor component according to FIG. 7.

The configuration of the clamping device 32 is shown in detail in FIGS. 5 and 6. A first partial region 40 of the clamping device 32 is arranged on the first side 34 of the first printed circuit board region 14 and exerts the desired clamping force on the sensor 22 by a first spring element 38. A second partial region 42 of the clamping device 32 engages around the first printed circuit board region 14 from the second side 36 thereof and acts as a counterholder for the clamping force by a plurality of supporting elements 44. As a result, the sensor 22 and the ring magnet 30 are fixed both with respect to one another and with respect to the printed circuit board 12.

The cross section through the clamping device 32 as shown in FIG. 6 reveals that the clamping device 32 has two further spring elements 46 in the second partial region 42. The spring elements 46 engage around the ring magnet 30 in order, in this direction, too, to position (or to center) and to hold the ring magnet 30 securely with respect to the sensor 22 and the printed circuit board 12.

Once the sensor 20 and the ring magnet 30 have been secured by the clamping device 32 in this way, the pre-assembly arrangement 48 thus formed is inserted into an injection-molding tool. When the injection-molding tool is closed, the desired angle between the printed circuit board regions 14, 16 is set on account of the geometry of the tool. Afterwards, the pre-assembly arrangement 48 is encapsulated with a plastic, such as a thermoplastic or thermosetting plastic, by injection molding. A plastic from the group of thermosetting plastics is preferably used in this case.

In this way, a plastic housing 50 is formed around the pre-assembly arrangement 48 and protects the printed circuit board 12 with the electronic components 20, the sensor 22 and the ring magnet 30 against damage and corrosion.

Overall, a sensor component 10 is thus provided which can be adapted flexibly to different structural space demands and is nevertheless simple to produce in this case.

A number of implementations have been described. Nevertheless, it will be understood that various modifications may be made without departing from the spirit and scope of the disclosure. Accordingly, other implementations are within the scope of the following claims.

What is claimed is:

1. A sensor component for a transmission of a motor vehicle, the sensor component comprising:
   a printed circuit board having:
      a first printed circuit board region, and
      a second printed circuit board region, the first printed circuit board region is delimited from the second printed circuit board region by a milled groove and is angled with respect to the second printed circuit board region along the milled groove,
   a sensor arranged in or on the first printed circuit board region, and
   a clamping device holding the sensor to the printed circuit board, the clamping device engages around the first printed circuit board region, such that the clamping device exerts a clamping force both on the sensor arranged on a first side of the first printed circuit board region, and on a second side of the first printed circuit board region.

2. The sensor component as claimed in claim 1, wherein the sensor includes a magnetoresistive sensor or a Hall sensor.

3. The sensor component as claimed in claim 1, wherein the sensor is electrically connected by an electrical connection to firstly at least one conductor track and/or secondly at least one electronic component in the second printed circuit board region.

4. The sensor component as claimed in claim 3, wherein the electrical connection includes a stamped plate.

5. The sensor component as claimed in claim 1, wherein the second printed circuit board region has at least one through opening in the region of an electronic component connected to the sensor.

6. The sensor component as claimed in claim 1, wherein the printed circuit board and the sensor are encapsulated by a plastic by injection molding.

7. The sensor component as claimed in claim 6, wherein the plastic includes a thermosetting plastic or a thermoplastic.

8. The sensor component as claimed in claim 1, which is configured for a transmission control of an automatic transmission of a motor vehicle.

9. The sensor component as claimed in claim 1, wherein the clamping force exerted on the sensor is less than 10 N.

10. The sensor component as claimed in claim 1, wherein the clamping device has at least one spring element for exerting the clamping force on the sensor.

11. The sensor component as claimed in claim 1, further comprising at least one additional component arranged in or on the first printed circuit board region.

12. The sensor component as claimed in claim 11, wherein the at least one additional component includes a ring magnet and/or a pole plate and/or a shielding plate.

13. The sensor component as claimed in claim 11, wherein the at least one additional component is held on the first printed circuit board region by a clamping device.

14. The sensor component as claimed in claim 13, wherein the clamping device has at least two spring elements, one spring element of which serves for exerting a clamping force on the at least one additional component and/or for aligning the at least one additional component relative to the sensor.

15. The sensor component as claimed in any of claim 11, wherein the at least one additional component are/is arranged in the region of a through opening in the first printed circuit board region.

16. A pre-assembly arrangement for a sensor component, the pre-assembly arrangement comprises:
    a printed circuit board having:
        a first printed circuit board region, and
        a second printed circuit board region, the first printed circuit board region is delimited from the second printed circuit board region by a milled groove;
    a sensor arranged in the first printed circuit board region; and
    a clamping device holding the sensor to the first printed circuit board region, such that the clamping device exerts a clamping force both on the sensor arranged on a first side of the first printed circuit board region, and on a second side of the first printed circuit board region.

17. The pre-assembly arrangement of claim 16, wherein the sensor includes a magnetoresistive sensor or a Hall sensor.

18. A method for producing a sensor component, the method comprising:
    providing a printed circuit board having a first printed circuit board region and a second printed circuit board region, wherein the first printed circuit board region is delimited from the second printed circuit board region by a milled groove;
    arranging a sensor in the first printed circuit board region;
    pre-fixing the sensor on the first printed circuit board region by a clamping device, the clamping device engaging around the first printed circuit board region, such that the clamping device exerts a clamping force both on the sensor arranged on a first side of the first printed circuit board region, and on a second side of the first printed circuit board region;
    inserting the printed circuit board into an injection-molding tool, wherein a predefined angle between the first printed circuit board region and the second printed circuit board region is predefined during the inserting; and
    encapsulating the printed circuit board with a plastic by injection molding.

* * * * *